United States Patent
Li

(10) Patent No.: US 9,786,700 B2
(45) Date of Patent: Oct. 10, 2017

(54) LOW TEMPERATURE POLY-SILICON (LTPS) THIN FILM TRANSISTORS (TFT) UNITS AND THE MANUFACTURING METHOD THEREOF

(71) Applicant: Wuhan China Star Optoelectronics Technology Co., Ltd., Wuhan, Hubei (CN)

(72) Inventor: Zijian Li, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/227,696

(22) Filed: Aug. 3, 2016

(65) Prior Publication Data

US 2017/0213858 A1    Jul. 27, 2017

(30) Foreign Application Priority Data

Jan. 21, 2016  (CN) .......................... 2016 1 0040587.8

(51) Int. Cl.

| H01L 27/14 | (2006.01) |
|---|---|
| H01L 27/12 | (2006.01) |
| H01L 29/786 | (2006.01) |
| G02F 1/1368 | (2006.01) |

(52) U.S. Cl.
CPC ........ H01L 27/1285 (2013.01); G02F 1/1368 (2013.01); H01L 27/1222 (2013.01); H01L 27/1262 (2013.01); H01L 29/78675 (2013.01); *G02F 2202/104* (2013.01)

(58) Field of Classification Search
None
See application file for complete search history.

(56) References Cited

U.S. PATENT DOCUMENTS

| 2009/0061575 A1* | 3/2009 | Kaitoh | ................ H01L 27/1285 438/166 |
|---|---|---|---|
| 2014/0159044 A1* | 6/2014 | Kishida | ................. G02F 1/1368 257/66 |
| 2014/0203309 A1* | 7/2014 | Ono | ................... H01L 29/42384 257/88 |
| 2015/0008439 A1* | 1/2015 | Yamazaki | ......... H01L 29/66757 257/72 |

\* cited by examiner

*Primary Examiner* — Alexander Ghyka
(74) *Attorney, Agent, or Firm* — Andrew C. Cheng

(57) ABSTRACT

The present disclosure relates to a LTPS TFT unit for liquid crystal modules and the manufacturing method thereof. The manufacturing method includes: forming a SiNx layer on a glass substrate; forming a SiOx layer and an a-Si layer on the SiNx layer in sequence; scanning the a-Si layer by laser beams to remove hydrogen within the a-Si layer; adopting excimer laser to re-crystallization anneal the a-Si layer to form the polysilicon layer; forming a gate insulation layer on the polysilicon layer; forming a gate on the gate insulation layer; and forming a drain insulation layer on the gate.

9 Claims, 2 Drawing Sheets

LOW TEMPERATURE POLY-SILICON (LTPS) THIN FILM TRANSISTORS (TFT) UNITS AND THE MANUFACTURING METHOD THEREOF

BACKGROUND OF THE INVENTION

1. Field of the Invention

The present disclosure relates to TFT units of liquid crystal display technology, and more particularly to a LTPS TFT unit for liquid crystal modules and the manufacturing method thereof.

2. Discussion of the Related Art

During the manufacturing process of LTPS TFT, generally, a hydrogen-filling process may be applied to the polysilicon layer, which saturates the chemical bonds so as to passivate internal defects of the polysilicon layer. During the hydrogen-filling process, the hydrogen within the SiNx film has to be spread into the polysilicon layer. It is well known that the lower film-forming temperature of the SiNx is, the higher content of the H within the SiNx film. Generally, the content of the H within the SiNx layer may not be affected when the temperature of the following manufacturing processes is below 400 degrees. Currently, the hydrogen film adopted by the hydrogen-filling process is the drain insulation layer (ILD) of the low-temperature SiNx. As there is only one source of hydrogen, the performance of the hydrogen-filling process is not good enough.

SUMMARY

The present disclosure relates to a LTPS TFT unit for liquid crystal module and the manufacturing method thereof to overcome the above problems.

In one aspect, a manufacturing method of low temperature poly-silicon (LTPS) thin film transistor (TFT) units for liquid crystal modules includes: forming a SiNx layer on a glass substrate; forming a SiOx layer and an a-Si layer on the SiNx layer in sequence; scanning the a-Si layer by laser beams to remove hydrogen within the a-Si layer; adopting excimer laser to re-crystallization anneal the a-Si layer to form the polysilicon layer; forming a gate insulation layer on the polysilicon layer; forming a gate on the gate insulation layer; and forming a drain insulation layer on the gate.

Wherein the step of forming the SiNx step further includes: adopting a plasma enhanced chemical vapor deposition method to form the SiNx layer with a temperature in a range between 200 and 300 degrees.

Wherein the step of forming the SiOx layer and the a-Si layer on the SiNx layer in sequence is conducted in an environment having a temperature in a range between 400 and 500 degrees.

Wherein the step of scanning the a-Si layer by laser beams to remove the hydrogen within the a-Si layer further includes: adopting the laser beams having a density of 200-300 mJ/cm$^2$.

Wherein the step of adopting the excimer laser to re-crystallization anneal the a-Si layer to form the polysilicon layer further includes: adopting the excimer laser having a density in a range between 380 and 480 mJ/cm$^2$.

Wherein the gate insulation layer is formed on the gate by physical vapor deposition (PVD).

Wherein the drain insulation layer includes the SiOx layer in a rim of the gate and the SiNx layer on the SiOx layer.

Wherein after the step of forming the drain insulation layer on the gate, the method further includes: heating the LTPS TFT unit to hydro-treat the polysilicon layer, wherein the SiNx layer within the drain insulation layer and the SiNx layer on a glass substrate provide the hydrogen during the hydro-treating process.

Wherein the gate insulation layer is formed on the gate by the plasma enhanced chemical vapor deposition method.

In another aspect, a LTPS TFT unit for liquid crystal modules manufactured by the above manufacturing method.

In view of the above, the manufacturing method of the LTPS TFT unit for liquid crystal modules adopts low-energy (about 200~300 mJ/cm$^2$) laser beams to scan the substrate to remove the hydrogen within the a-Si layer, which replaces the conventional heat baking process. As such, the content of the H (Hydrogen) within the SiNx layer of the buffering layer (the SiOx layer and the a-Si layer) may not be affected. In the subsequent hydro-treating process, the SiNx layer and the drain insulation layer provides the H (Hydrogen), which ensures that the hydrogen-filling process of the polysilicon layer may be completely conducted. In this way, the hydrogen-filling performance is better so as to enhance the electrical performance of the TFT. At the same time, as the low-energy laser is adopted to remove the H (Hydrogen) within the a-Si layer, the impact of the thermal expansion and contraction effect caused by the heating process, such as the conventional heat baking process, may be reduced, and thus the substrate is prevented from being damaged.

DETAILED DESCRIPTION OF THE EMBODIMENTS

Embodiments of the invention will now be described more fully hereinafter with reference to the accompanying drawings, in which embodiments of the invention are shown.

Figure 1:
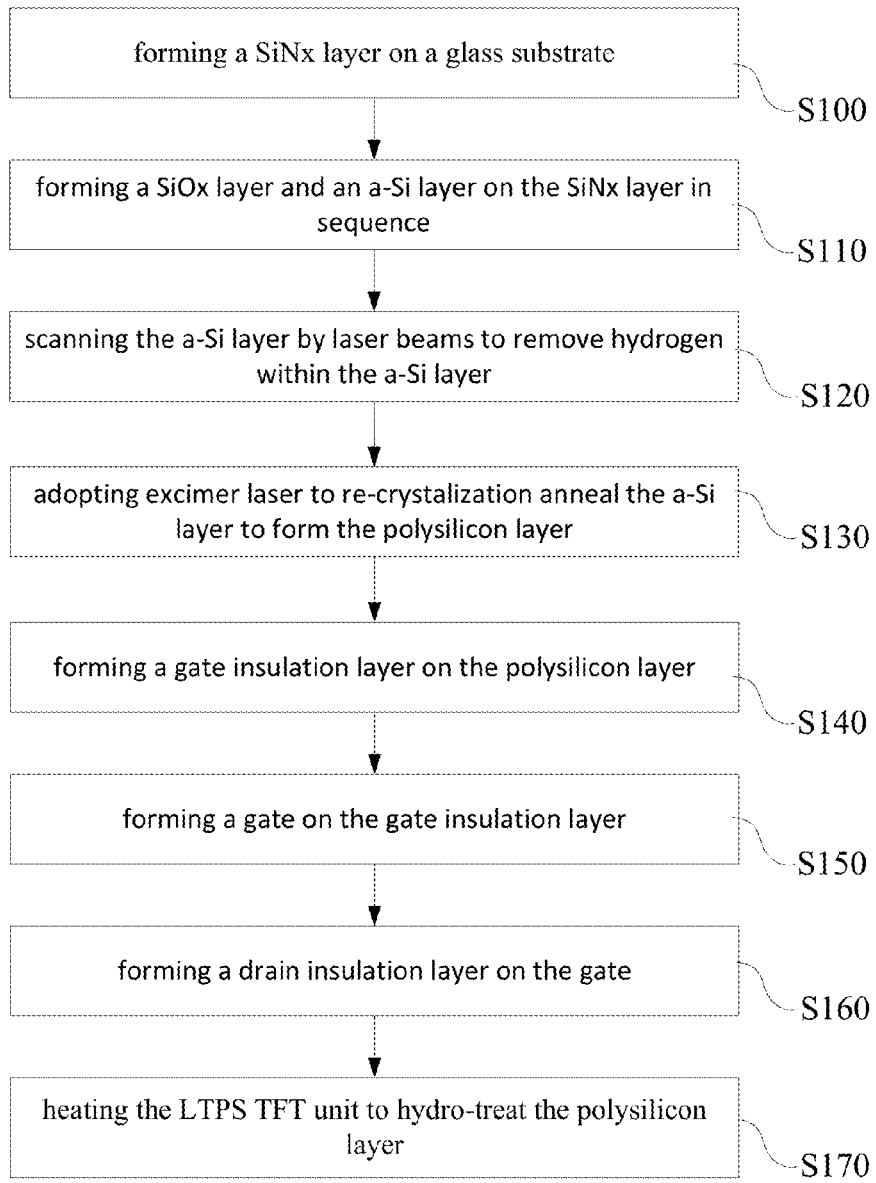
FIG. 1 is a flowchart illustrating the manufacturing method of the LTPS TFT unit for liquid crystal modules in accordance with one embodiment.

FIG. 1 is a flowchart illustrating the manufacturing method of the LTPS TFT unit for liquid crystal modules in accordance with one embodiment. The method includes the following steps.

In step S100, forming a SiNx layer on a glass substrate.

Figure 2:
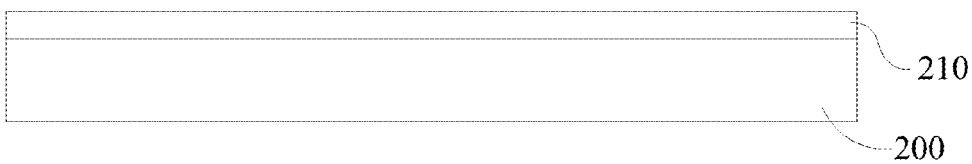
FIG. 2 is a schematic view of the SiNx layer formed on a glass substrate in accordance with one embodiment.

In step S100, adopting a plasma enhanced chemical vapor deposition method, and forming the SiNx layer under a low temperature environment with the temperature in a range between 200 and 300 degrees. FIG. 2 is a schematic view of the SiNx layer formed on a glass substrate in accordance with one embodiment, wherein the reference numeral 200 relates to the glass substrate, and the reference numeral 210 relates to the low-temperature SiNx layer.

In step S110, forming a SiOx layer and an a-Si layer on the SiNx layer in sequence.

Figure 3:
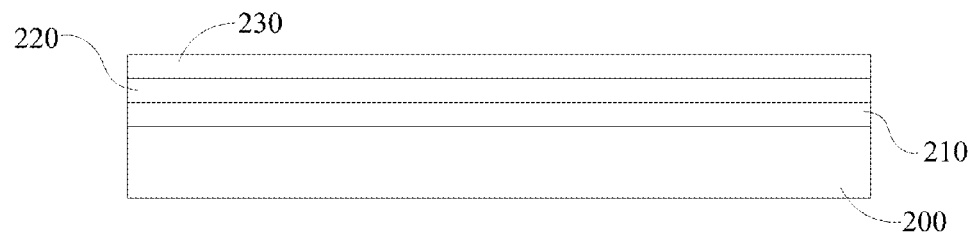
FIG. 3 is a schematic view of the SiOx layer and the a-Si layer in accordance with one embodiment.

In step S110, the step of forming the SiOx layer and the a-Si layer on the SiNx layer in sequence is conducted in the environment having a temperature in a range between 400 and 500 degrees. FIG. 3 is a schematic view of the SiOx layer and the a-Si layer in accordance with one embodiment, wherein the reference numeral 220 relates to the SiOx layer, and the reference numeral 230 relates to the a-Si layer.

In step S120, scanning the a-Si layer by laser beams to remove hydrogen within the a-Si layer.

In step S120, regarding the step of scanning the a-Si layer by laser beams to remove hydrogen within the a-Si layer, the laser beam is the low-energy laser beams having a density of 200-300 mJ/cm$^2$. The temperature of the low-energy laser activating on a surface of the a-Si layer 230 is in a range between 550 and 600 degrees so as to remove the hydrogen. As the heat insulation effect of the SiOx layer 220 and the heat-absorbing effect of the glass substrate 200, the temperature of a bottom of the SiNx layer 210 is only 350 degrees. In this way, the content of the H (Hydrogen) of the SiNx layer 210 may not be affected. Compared to conventional heat baking process for removing the hydrogen, the heating temperature of the SiNx layer 210 may be lower so as to maintain the H (Hydrogen) of the SiNx layer 210.

In step S130, adopting excimer laser to re-crystallization anneal the a-Si layer so as to form the polysilicon layer.

Figure 4:
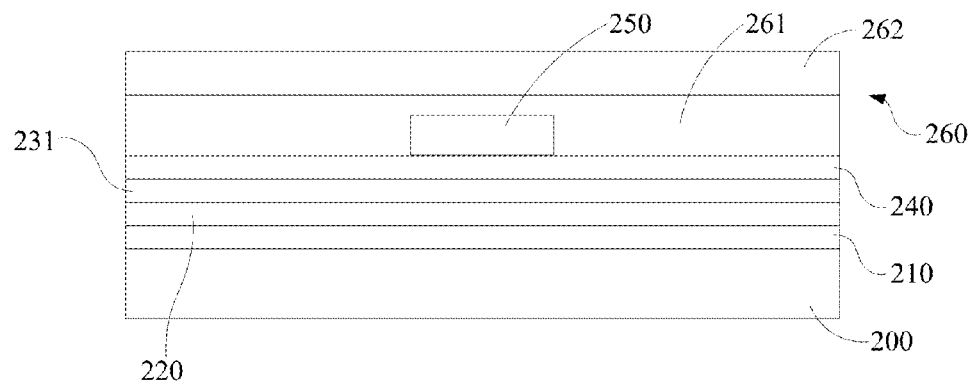
FIG. 4 is a schematic view of the gate insulation layer, the gate, and the insulation layer in accordance with one embodiment.

In step S130, the density of the excimer laser is in the range between 380 and 480 mJ/cm$^2$, which is high-energy laser. This condition may not affect the content of the H (Hydrogen) within the SiNx layer 210. Even though a few H (Hydrogen) is diffused, the diffused H (Hydrogen) may arrive the polysilicon layer, and thus no H (Hydrogen) is lost. FIG. 4 is a schematic view of the gate insulation layer, the gate, and the insulation layer in accordance with one embodiment, wherein the reference numeral 231 is the polysilicon layer.

In step S140, forming a gate insulation layer on the polysilicon layer.

In step S140, the first polarizer 240 may be formed on the polysilicon layer 231 by the plasma enhanced chemical vapor deposition method.

In step S150, forming a gate 250 on the gate insulation layer 240.

In step S150, the gate insulation layer 240 may be formed on the gate 250 by physical vapor deposition (PVD).

In step S160, forming a drain insulation layer 260 on the gate 250.

In step S160, the gate 250 may be formed on the drain insulation layer 260 by the plasma enhanced chemical vapor deposition method. The drain insulation layer 260 includes a SiOx layer 261 and a SiNx layer 262 on the SiOx layer 261.

Preferably, the manufacturing method further includes the step S170: heating the LTPS TFT unit to hydro-treat the polysilicon layer 231. Specifically, a heating process with the temperature in a range between 450 and 550 is performed for 15 to 30 minutes, wherein the SiNx layer 262 within the drain insulation layer 260 and the SiNx layer 210 on the glass substrate provide the hydrogen during the hydro-treating process.

In view of the above, the manufacturing method of the LTPS TFT unit for liquid crystal modules adopts low-energy (about 200~300 mJ/cm$^2$) laser beams to scan the substrate to remove the hydrogen within the a-Si layer, which replaces the conventional heat baking process. As such, the content of the H (Hydrogen) within the SiNx layer of the buffering layer (the SiOx layer and the a-Si layer) may not be affected. In the subsequent hydro-treating process, the SiNx layer and the drain insulation layer provides the H (Hydrogen), which ensures that the hydrogen-filling process of the polysilicon layer may be completely conducted. In this way, the hydrogen-filling performance is better so as to enhance the electrical performance of the TFT. At the same time, as the low-energy laser is adopted to remove the H (Hydrogen) within the a-Si layer, the impact of the thermal expansion and contraction effect caused by the heating process, such as the conventional heat baking process, may be reduced, and thus the substrate is prevented from being damaged.

Further, the present disclosure also includes a LTPS TFT unit for the liquid crystal modules. Referring to FIGS. 2-4, the TFT unit may be manufactured by the methods in the above embodiment, and the structure regarding the components other than the LTPS TFT may be conceived by persons skilled in the art, and thus are omitted hereinafter.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of low temperature polysilicon (LTPS) thin film transistor (TFT) units for liquid crystal modules, comprising:
    forming a SiNx layer on a glass substrate;
    forming a SiOx layer and an a-Si layer on the SiNx layer in sequence;
    scanning the a-Si layer by laser beams to remove hydrogen within the a-Si layer;
    adopting excimer laser to re-crystallization anneal the a-Si layer to form the polysilicon layer;
    forming a gate insulation layer on the polysilicon layer;
    forming a gate on the gate insulation layer; and
    forming a drain insulation layer on the gate, the drain insulation layer comprising one SiOx layer and one SiNx layer arranged above the SiOx layer, and the SiOx layer being arranged in a rim of the gate.

2. The manufacturing method claimed in claim 1, wherein the step of forming the SiNx step further comprises:
    adopting a plasma enhanced chemical vapor deposition method to form the SiNx layer with a temperature in a range between 200 and 300 degrees.

3. The manufacturing method claimed in claim 1, wherein the step of forming the SiOx layer and the a-Si layer on the SiNx layer in sequence is conducted in an environment having a temperature in a range between 400 and 500 degrees.

4. The manufacturing method claimed in claim 1, wherein the step of scanning the a-Si layer by laser beams to remove the hydrogen within the a-Si layer further comprises:
    adopting the laser beams having a density of 200-300 mJ/cm$^2$.

5. The manufacturing method claimed in claim 1, wherein the step of adopting the excimer laser to re-crystallization anneal the a-Si layer to form the polysilicon layer further comprises:
    adopting the excimer laser having a density in a range between 380 and 480 mJ/cm$^2$.

6. The manufacturing method claimed in claim 1, wherein the gate insulation layer is formed on the gate by physical vapor deposition (PVD).

7. The manufacturing method claimed in claim 1, wherein after the step of forming the drain insulation layer on the gate, the method further comprises:
    heating the LTPS TFT unit to hydro-treat the polysilicon layer, wherein the SiNx layer within the drain insulation layer and the SiNx layer on a glass substrate provide the hydrogen during the hydro-treating process.

8. The manufacturing method claimed in claim 1, wherein the gate insulation layer is formed on the gate by the plasma enhanced chemical vapor deposition method.

9. A low temperature poly-silicon (LTPS) thin film transistor (TFT) unit for liquid crystal modules manufactured by the manufacturing method as claim 1.

\* \* \* \* \*